(12) United States Patent
Zuckerstatter et al.

(10) Patent No.: US 6,914,796 B1
(45) Date of Patent: Jul. 5, 2005

(54) SEMICONDUCTOR MEMORY ELEMENT WITH DIRECT CONNECTION OF THE I/OS TO THE ARRAY LOGIC

(75) Inventors: Andrea Zuckerstatter, Dachau (DE); Johann Pfeiffer, Ottobrunn (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/651,804

(22) Filed: Aug. 29, 2003

(30) Foreign Application Priority Data

Sep. 5, 2002 (DE) .......................................... 102 41 142

(51) Int. Cl.$^7$ ................................................ G11C 5/02
(52) U.S. Cl. ........................ 365/51; 365/63; 365/230.03
(58) Field of Search .............................. 365/51, 52, 63, 365/189.01, 230.03

(56) References Cited

U.S. PATENT DOCUMENTS 5,532,970 A * 7/1996 Butler et al. ........... 365/230.05
5,798,282 A * 8/1998 Bertin et al. ................. 438/15
6,611,935 B1 * 8/2003 Landry ........................ 714/736

OTHER PUBLICATIONS

IBM Journal of Research Development (T. Sunaga et al. A 64Kb × 32 DRAM for graphics applications Jan./Mar. 1995, pp. 43–50).

* cited by examiner

*Primary Examiner*—Gene N. Auduong
(74) *Attorney, Agent, or Firm*—St. Onge Steward Johnston & Reens LLC

(57) ABSTRACT

The invention relates to a semiconductor memory element comprising a plurality of data pins and at least two memory cell arrays, each of which comprises a plurality of memory cells, and each of which is connected to an array logic for reading in and/or reading out data into or from the respective array, wherein the data pins or interface circuits connected therewith are directly connected to the respective array logic.

15 Claims, 3 Drawing Sheets

Prior Art

SEMICONDUCTOR MEMORY ELEMENT WITH DIRECT CONNECTION OF THE I/OS TO THE ARRAY LOGIC

This application claims priority of pending German Patent Application No. 102 41 142.5 filed on Sep. 5, 2002.

FIELD OF THE INVENTION

The invention relates to a semiconductor memory element in accordance with the preamble of claim 1.

In the case of semiconductor memory elements, a differentiation is made between so-called functional memory elements (e.g. PLAs, PALs, etc.) and so-called table memory elements, e.g. ROM elements (ROM=Read Only Memory) and RAM elements (RAM=Random Access Memory or read-write memory, respectively).

A RAM element is a memory in which data can be stored by giving in an address, and can again be read out later under this address.

The corresponding address may e.g. be input to the RAM element via so-called address pins or address input pins. For inputting and outputting of the data, a plurality, e.g. 16, of so-called data pins or data input/output pins (I/Os or Input/Outputs, respectively) are provided. By applying a corresponding signal (e.g. a read/write signal) to a write/read selection pin it may be selected whether data are to be stored or read out (at the moment).

Since as many memory cells as possible are to be accommodated in a RAM element, one has tried to make their structure as simple as possible. In the case of so-called SRAMs (SRAM=Static Random Access Memory), the individual memory cells consist of e.g. few, for instance 6, transistors and in the case of so-called DRAMS (DRAM=Dynamic Random Access Memory), in general of one single, correspondingly triggered capacitor only, with the capacity of which one bit may be stored as charge. This charge, however, remains existing for a short time only; therefore, a so-called "refresh" must be performed regularly, e.g. every 64 ms.

For technological reasons, the individual memory cells are arranged in a rectangular matrix or array, respectively, in the case of RAM elements.

To achieve a correspondingly high total storage capacity, a plurality of, e.g. four different, rectangular arrays, may be provided in one single RAM element or chip, respectively.

The above-mentioned address then will have to be increased by the number of positions required for addressing or selecting the respective array.

The data that are output by or input to the respective arrays are guided via corresponding lines (e.g. via 64 different write/read data lines) which are connected via a control logic—comprising e.g. corresponding multiplexers or de-multiplexers, timers, registers, etc.—with a chip-internal data path or data bus used by all arrays jointly and comprising e.g. 16 bits.

The corresponding (e.g. 16 different) lines of the internal data path are connected to the above-mentioned (e.g. 16 different) data input/output pins (I/Os).

The development of memory elements with ever larger storage capacities renders it increasingly difficult to increase the clock frequency of the clock signals used for coordinating in time the processing or transferring of the data.

In prior art, so-called DDR elements, in particular DDR DRAMS, are known (DDR DRAM=Double Data Rate DRAM).

In the case of DDR elements, instead of one single clock signal available at a single line (single ended clock signal), two differential, oppositely inverse clock signals available at two separate lines are used.

In DDR elements, the data are, in general, transferred both on the rising edge of the first clock signal and on the rising edge of the second clock signal (or both on the falling edge of the first clock signal and on the falling edge of the second clock signal, respectively). Thus, in a DDR element the data are transferred more frequently or quickly, respectively (in particular twice as frequently or twice as quickly, respectively) than in corresponding conventional elements with single or single ended clock signal. This means that the data rate is higher than, in particular twice as high as, with corresponding conventional elements.

The maximum amount of data that may be written into (or read out from) the above-mentioned arrays per time unit may e.g. be limited by the above-explained transfer of the data in the (or to the (or from the)) data path which leads to delays, or, respectively, by the fact that merely a restricted number of, e.g. 16, data input/output pins (I/Os) is available.

It is an object of the invention to provide a novel semiconductor memory element.

This and further objects are achieved by the subject matter of claim 1.

Advantageous further developments of the invention are indicated in the subclaims.

In accordance with a basic idea of the invention, a semiconductor memory element comprising a plurality of data pins and at least two memory cell arrays is provided, each of them comprising a plurality of memory cells and being connected to an array logic for reading in and/or out data into or from the respective array, with the data pins (or interface circuits connected therewith) being directly connected to the respective array logic.

It is particularly advantageous when the data pins or the interface circuits that are connected therewith are connected to the respective array logic without a data path jointly used by the memory cell arrays being interposed.

The effect thereof is that a larger amount of data per time unit can be written into (or read out from) the arrays than with conventional semiconductor memory elements.

In a preferred development of the invention, at least one corresponding array logic is not arranged outside and adjacent to the allocated array, but within the respective array, in particular in the middle of the respective array. The (maximum) length of the write/read lines ($d_{in}/d_{out}$) (or of the corresponding write lines ($d_{in}$) or of the corresponding read lines ($d_{out}$))—leading from the respective array logic to the respective memory elements—is consequently shorter than, in particular only half as long as, with conventional semiconductor memory elements.

Thus, a clock frequency that is increased vis-à-vis conventional memory elements may be used, this making it possible to write into (or read out from) the arrays a further increased amount of data per time unit.

BRIEF DESCRIPTION OF THE DRAWINGS

In the following, the invention will be explained in detail by means of embodiments and the enclosed drawing. The drawing shows.

DETAILED DESCRIPTION OF THE DRAWINGS

Figure 1:
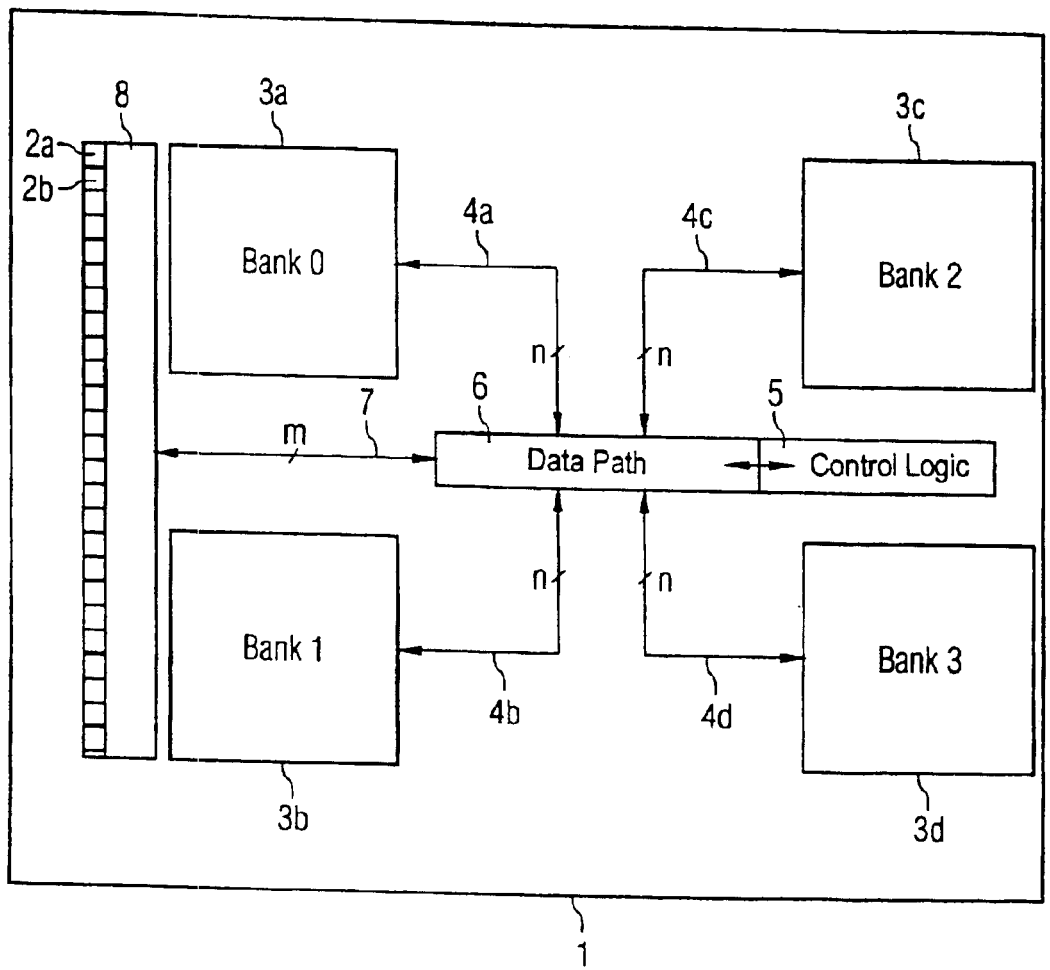
FIG. 1 a schematic representation of a prior art semiconductor memory element.

FIG. 1 shows a schematic representation of a semiconductor memory element 1 or a semiconductor memory chip, respectively, in accordance with prior art.

The semiconductor memory element 1 may e.g. be a DRAM memory element (DRAM=Dynamic Random Access Memory or dynamic read-write memory, respectively) based on CMOS technology, e.g. an SDRAM memory element, in particular a DDR DRAM (DDR DRAM=Double Data Rate DRAM).

In the semiconductor memory element 1—after a corresponding address was applied to the (not illustrated) address pins or address input pads, respectively—data may be stored under the respective address and may later on be read out again under this address.

For inputting and outputting of the data, a number m of data pins 2a, 2b or data input/output pads (I/Os or Input/Outputs, respectively) is provided, here e.g. 16 data pins 2a, 2b.

By applying a corresponding signal (e.g. a read/write signal) to a write/read selection pin or pad, respectively, which is not illustrated here, it can be selected whether data are to be stored or to be read out.

The data pins 2a, 2b, the address pins, the write/read selection pin, and possibly further (not illustrated) pins, e.g. a chip select pin, etc. may e.g. be distributed substantially regularly along the outer edge of the semiconductor memory element 1 or semiconductor memory chip 1, respectively (or e.g. at two opposite outer edges).

The data that are input in the semiconductor memory element 1 are stored there in corresponding memory cells and are later on read out again from the corresponding memory cells.

Each memory cell consists e.g. of few, in particular of only one single, correspondingly triggered capacitor(s) with the capacity of which one bit respectively can be stored as charge.

A particular amount of memory cells is arranged in a rectangular or square matrix 3a, 3b, 3c, 3d or array, respectively, so that e.g. 32 MBit, 64 MBit, 128 MBit, 256 MBit, etc. can be stored in a matrix 3a, 3b, 3c, 3d—corresponding to the number of memory cells contained.

As is further illustrated in FIG. 1, the semiconductor memory element 1 comprises a number k of memory cell arrays 3a, 3b, 3c, 3d (here e.g. four of substantially identical structure and distributed regularly over the area of the element), so that a total storage capacity of e.g. 128 MBit, 256 MBit, 512 MBit, or 1024 MBit (or 1 GBit, respectively), correspondingly results for the semiconductor memory element 1.

The above-mentioned address available at the address pins contains a corresponding number of bits (here e.g. two bits) serving to address the respectively desired memory cell array 3a, 3b, 3c, 3d during the storing or reading out of data.

The data output from (and correspondingly also input to) the respective arrays 3a, 3b, 3c, 3d are respectively guided via corresponding write/read data line bundles 4a, 4b, 4c, 4d connected with the respective arrays 3a, 3b, 3c, 3d. Each write/read data line bundle 4a, 4b, 4c, 4d comprises a particular number (here: 64) of lines.

The write/read data line bundles 4a, 4b, 4c, 4d are connected via a control logic 5—which comprises corresponding multiplexers or demultiplexers, timers, registers, etc.—with a chip-internal data path 6 or data bus, respectively, used by all arrays 3a, 3b, 3c, 3d jointly.

The data path 6 comprises a particular number m (here: 16) of lines 7, wherein the line number corresponds to the above-mentioned number m of data pins 2a, 2b or data input/output pads (I/Os or Input/Outputs, respectively), and wherein each individual line of the lines 7 is connected—by interposing of a corresponding interface circuit arrangement 8—with a corresponding data pin 2a, 2b allocated to the respective individual line.

Figure 2:
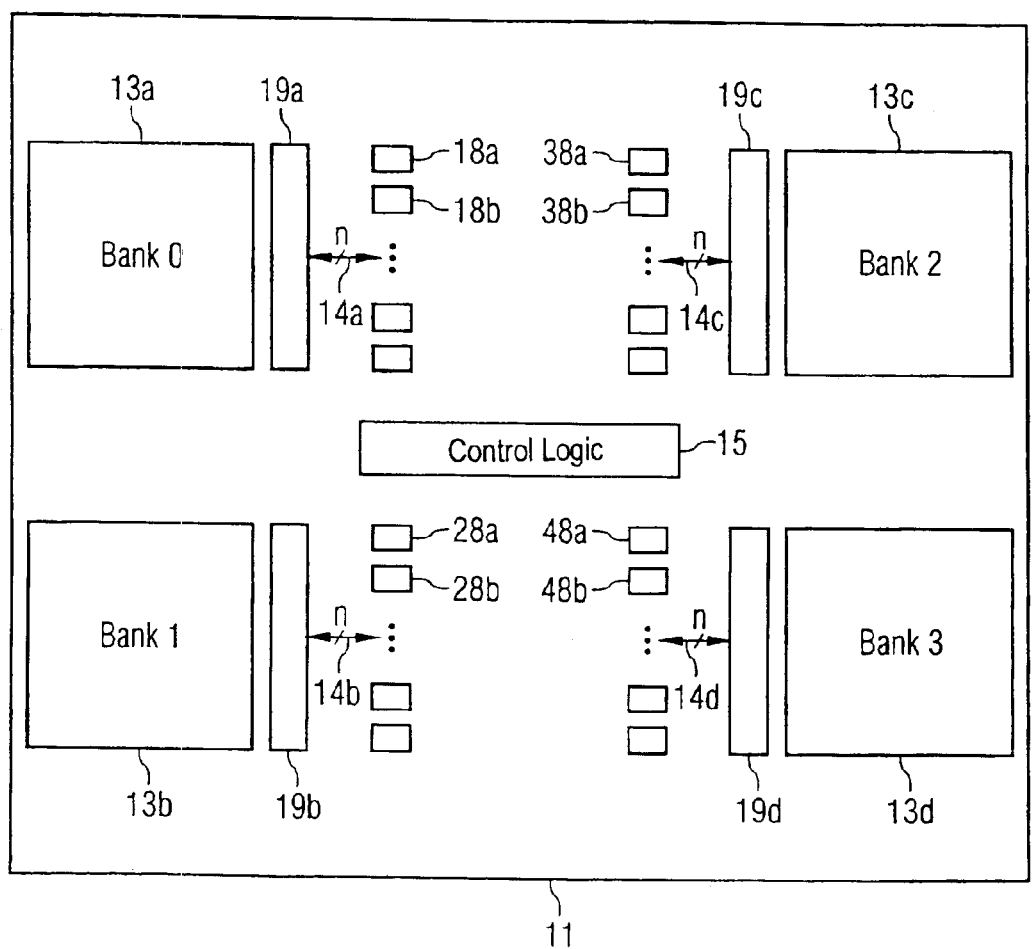
FIG. 2 a schematic representation of a semiconductor memory element according to an embodiment of the present invention.

FIG. 2 shows a schematic representation of a semiconductor memory element 11 or a semiconductor memory chip, respectively, in accordance with an embodiment of the present invention.

The semiconductor memory element 11 may e.g. be a DRAM memory element (DRAM=Dynamic Random Access Memory or dynamic read-write memory, respectively) based on CMOS technology, e.g. an SDRAM memory element, in particular a DDR DRAM (DDR DRAM=Double Data Rate DRAM).

In the case of the semiconductor memory element 11—after a corresponding address has been applied to the (not illustrated) address pins or address input pads, respectively,—data may be stored under the respective address and may be read out later on again under this address. In order to save address pins, the address may be input in several, e.g. two, steps and may be stored intermediately in the semiconductor memory element 11 (e.g. the line address—when an RAS signal (Row Address Strobe signal) is available—in a corresponding Row Address Latch, and—when a CAS signal (Column Address Strobe signal) is available—the column address in a corresponding Column Address Latch).

For inputting and outputting of the data, as will be explained more exactly in the following, a substantially larger amount I of data pins or data input/output pads (I/Os or Input/Outputs, respectively) is provided than with the conventional semiconductor memory element 1 illustrated in FIG. 1.

By applying a corresponding signal (e.g. a read/write signal) to a write/read selection pin or pad, respectively (not illustrated), it can be selected whether data are to be stored or to be read out.

The data pins, the address pins, the write/read selection pin, and possibly further (not illustrated) pins, e.g. a chip select pin, etc. may e.g. be distributed substantially regularly along the outer edge of the semiconductor memory element 11 or the semiconductor memory chip 11, respectively (or e.g. at two opposite outer edges).

The data that are input in the semiconductor memory element 11 are stored in corresponding memory cells there and are read out later on again from the corresponding memory cells.

Each memory cell consists of few, in particular of only one single, correspondingly triggered capacitor with the capacity of which one bit respectively can be stored as charge.

A particular number of memory cells is arranged in a rectangular or square matrix 13a, 13b, 13c, 3d or array, respectively, so that e.g. 32 MBit, 64 MBit, 128 MBit, 256 MBit, etc. can be stored in a matrix 13a, 13b, 13c, 13d—corresponding to the number of memory cells contained, and correspondingly similar to the semiconductor memory element 1 illustrated in FIG. 1.

As is further illustrated in FIG. 2, the semiconductor memory element 11 comprises a number k of memory cell arrays 13a, 13b, 13c, 13d (here e.g. four of substantially identical structure and distributed regularly over the area of the element), so that a total storage capacity of e.g. 128 MBit, 256 MBit, 512 MBit, or 1024 MBit or 1 GBit, respectively, correspondingly results for the semiconductor memory element 11.

The above-mentioned address available at the address pins comprises a number of bits (here e.g. two bits)—corresponding to the number k of memory cell arrays 13a, 13b, 13c, 13d—which serve to address the respectively desired memory cell array 13a, 13b, 13c, 13d during the storing or reading out of data, and which can e.g. be evaluated by a control logic 15 which is centrally provided for the k arrays 13a, 13b, 13c, 13d.

The data that are output by the respective arrays 13a, 13b, 13c, 13d (and correspondingly also the data that are input thereto) are respectively guided via corresponding bi-directional write read data line bundles 14a, 14b, 14c, 14d connected with the respective arrays 13a, 13b, 13c, 13d.

Each write/read data line bundle 14a, 14b, 14c, 14d comprises a particular number n (here: 64) of lines. The number n of lines may e.g. correspond to the number n of memory cells contained in a column (or a line, respectively) of the respective array 13a, 13b, 13c, 13d, or to a particular fraction thereof (thus—e.g. in the scope of a so-called 4-bit prefetch—n-bit, i.e. here: 64-bit data may simultaneously be written in the respective array 13a, 13b, 13c, 13d (or be read out therefrom, respectively)).

Each line of the corresponding write/read data line bundle 14a, 14b, 14c, 14d is connected via a corresponding (column) data read-in/read-out logic 19a, 19b, 19c, 19d or array logic ("JDCOLUMN"), respectively, with all memory cells contained in a corresponding column (or alternatively: in a corresponding line), namely e.g. either via an individual, bidirectional write/read line ($d_{in}/d_{out}$), or e.g. via two separate lines (namely a write line ($d_{in}$) and a read line ($d_{out}$)).

The (column) data read-in/read-out logic 19a, 19b, 19c, 19d comprises e.g. the amplifiers (sense amplifiers, in particular the so-called secondary sense amplifiers) provided for reading out the data stored in the memory cells, the corresponding address decoders, and e.g. the memories necessary for intermediate storage of the column (or line) address. The data read-in/tread-out logic 19a, 19b, 19c, 19 is e.g. arranged at an edge area of the respective array 13a, 13b, 13c, 13d or adjacent thereto.

Contrary to the semiconductor memory element illustrated in FIG. 1, the write/read data line bundles 14a, 14b, 14c, 14d are not connected with a chip-internal data path that is connected with the respective data input/output pads (I/Os) and is jointly used by all arrays 13a, 13b, 13c, 13d.

Instead, as is illustrated in FIG. 2, the respective lines of the respective write/read data line bundles 14a, 14b, 14c, 14d are directly connected with the corresponding data pins or data input/output pads (I/Os or Input/Outputs, respectively) (or—alternatively—by the interposition of e.g. interface circuits 18a, 18b, 28a, 28b, 38a, 38b, 48a, 48b comprising corresponding line drivers, level converters, etc. which are respectively connected with the corresponding data pins via corresponding—not illustrated—bidirectional lines).

The write/read data line bundles 14a, 14b, 14c, 14d are directly connected to the amplifiers ((secondary) sense amplifiers) contained in the data read-in/read-out logic 19a, 19b, 19c, 19d and provided for reading out the data stored in the memory cells (thus, the data pins or data input/output pads of the semiconductor memory element 11 are also directly connected to the data read-in/read-out logic or array logic, respectively, in particular directly to the corresponding amplifiers ((secondary) sense amplifiers) (possibly by interposition of the above-mentioned interface circuits 18a, 18b, 28a, 28b, 38a, 38b, 48a, 48b , wherein these may be positioned directly next to the corresponding data read-in/read-out logic 19a, 19b, 19c, 19d, or e.g. at the edge of the semiconductor memory element 11, adjacent to the respectively allocated data pins)).

As is illustrated in FIG. 2, the number 1 of data pins or data input/output pads, respectively, corresponds to the number k of memory cell arrays 13a, 13b, 13c, 13d provided in the semiconductor memory element 11, multiplied by the number n of lines provided for the respective array 13a, 13b, 13c, 13d in the respective write/read data line bundle 14a, 14b, 14c, 14d (or the number n of columns (or lines, respectively) in the respective array 13a, 13b, 13c, 13d), or the above-mentioned fraction thereof) (thus here I=k×n=256 data pins or data input/output pads, respectively).

The n data pins or data inpuvoutput pads, respectively, allocated to the respective array 13a, 13b, 13c, 13d may e.g. be positioned at an edge of the semiconductor memory element 11 or semiconductor memory chip 11, respectively, which is adjacent (or e.g. respectively closest) to the respective array 13a, 13b, 13c, 13d.

By the direct connection of the data input/output pads to the array logic, a larger amount of data may be written in the arrays 13a, 13b, 13c, 13d (or read out therefrom, respectively) per time unit than with the semiconductor memory element 1 illustrated in FIG. 1 (or, respectively, can the clock frequency be increased without an increased CAS latency period resulting).

Figure 3:
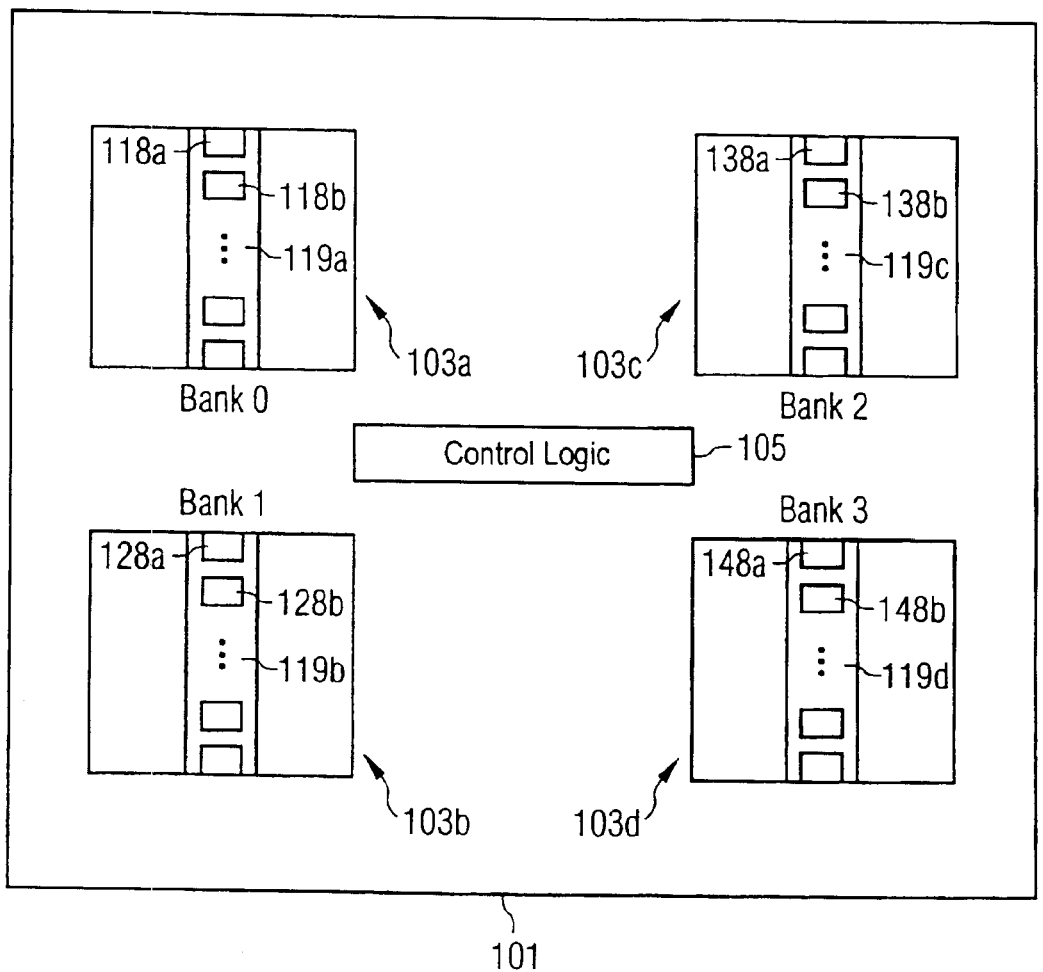
FIG. 3 a schematic representation of a semiconductor memory element according to a further embodiment of the present invention.

FIG. 3 is a schematic representation of a semiconductor memory element 101 or semiconductor memory chip, respectively, in accordance with a further embodiment of the present invention.

The semiconductor memory element 101 may—like e.g. the semiconductor memory element 11 illustrated in FIG. 2—for instance be a DRAM memory element (DRAM=Dynamic Random Access Memory or dynamic read-write memory, respectively) based on CMOS technology, e.g. an SDRAM memory element, in particular a DDR DRAM (DDR DRAM=Double Data Rate DRAM).

In the case of the semiconductor memory element 101—after a corresponding address has been applied to the (not illustrated) address pins or address input pads, respectively,—data may be stored under the respective address and may be read out later on again under this address. In order to save address pins, the address may be input in several, e.g. two, steps and may be stored intermediately in the semiconductor memory element 101 (e.g. the line address—when an RAS signal (Row Address Strobe signal) is available—in a corresponding Row Address Latch, and—when a CAS signal (Column Address Strobe signal) is available—the column address in a corresponding Column Address Latch).

For inputting and outputting of the data, in analogy to the semiconductor memory element 11 illustrated in FIG. 2, an amount 1 of data pins or data input/output pads (I/Os or Input/Outputs, respectively) is provided which is substantially larger than that with the conventional semiconductor memory element 1 illustrated in FIG. 1.

By applying a corresponding signal (e.g. a read/write signal) to a write/read selection pin or pad, respectively (not illustrated), it can be selected whether data are to be stored or to be read out.

The data pins, the address pins, the write/read selection pin, and possible further (not illustrated). pins, e.g. a chip select pin, etc. may e.g. be distributed substantially regularly along the outer edge of the semiconductor memory element 101 or the semiconductor memory chip 101, respectively (or e.g. at two opposite outer edges).

The data that are input in the semiconductor memory element 101 are stored in corresponding memory cells there and are read out later on again from the corresponding memory cells.

Each memory cell consists of one single, correspondingly triggered capacitor with the capacity of which one bit respectively can be stored as charge.

A particular number of memory cells is arranged in a substantially square (or rectangular, respectively) matrix 103a, 103b, 103c, 103d or array, respectively, so that e.g. 32 MBit, 64 MBit, 128 MBit, 256 MBit, etc. can be stored in a matrix 103a, 103b, 103c, 103d—corresponding to the number of memory cells contained, and correspondingly similar to the semiconductor memory elements 1, 11 illustrated in FIGS. 1 and 2.

As is further illustrated in FIG. 3, the semiconductor memory element 101 comprises a number k of memory cell arrays 103a, 103b, 103c, 103d (here e.g. four of substantially identical structure and distributed regularly over the area of the element), so that a total storage capacity of e.g. 128 MBit, 256 MBit, 512 MBit, or 1024 MBit, respectively, correspondingly results for the semiconductor memory element 101.

The above-mentioned address available at the address pins comprises a number of bits (here e.g. two bits)—corresponding to the number k of memory cell arrays 103a, 103b, 103c, 103d—which serve to address the respectively desired memory cell array 103a, 103b, 103c, 103d during the storing or reading out of data, and which can e.g. be evaluated by a control logic 105 which is centrally provided for the k arrays 103a, 103b, 103c, 103d.

The data output by the respective arrays 103a, 103b, 103c, 103d (and correspondingly also the data input thereto) are respectively guided via corresponding bidirectional write/read data line bundles connected with the respective arrays 103a, 103b, 103c, 103d.

Each write/read data line bundle compnses a particular number n (here: 64) of lines. The number n of lines may e.g. correspond to the number n of memory cells contained in a column (or a line, respectively) of the respective array 103a, 103b, 103c, 103d, or to a particular fraction thereof (thus—e.g. in the scope of a so-called 4-bit prefetch—n-bit, i.e. here: 64-bit data may simultaneously be written in the respective array 103a, 103b, 103c, 103d (or be read out therefrom, respectively)).

Each line of the corresponding write/read data line bundle is connected via a corresponding (column) data read-in/read-out logic 119a, 119b, 119c, 119d or array logic ("JDCOLUMN"), respectively, with all memory cells contained in a corresponding column (or alternatively: in a corresponding line), namely e.g. either via an individual, bi-directional write/read line ($d_{in}/d_{out}$), or e.g. via two separate lines (namely a write line ($d_{in}$) and a read line ($d_{out}$)).

The data read-in/read-out logic 119a, 119b, 119c, 119d comprises e.g. the amplifiers (sense amplifiers, in particular the so-called secondary sense amplifiers) provided for reading out the data stored in the memory cells, the corresponding address decoders, and e.g. the memories necessary for intermediate storage of the column (or line) address.

Contrary to the semiconductor memory elements 1, 11 illustrated in FIGS. 1 and 2, the corresponding data read-in/read-out logic 119a, 119b, 119c, 119d is arranged with the semiconductor memory element 101 in a central area of the respective array 103a, 103b, 103c, 103d, in particular in the middle of the respective array 103a, 103b, 103c, 103d, e.g. as illustrated in FIG. 3—in an area which extends in parallel to the memory elements respectively arranged in a particular column (alternatively: a particular line) of the respective array 103a, 103b, 103c, 103d. In the semiconductor memory element 101 illustrated in FIG. 3, the number of memory elements positioned at the left of the respective data read-in/read-out logic 119a, 119b, 119c, 119d of the respective array 103a, 103b, 103c, 103d is as large as the number of memory elements positioned at the right of the respective data read-in/read-out logic 119a, 119b, 119c, 119d of the respective array 103a,103b, 103c, 103d.

Similar to the semiconductor memory element 11 illustrated in FIG. 2, in the semiconductor memory element 101 illustrated in FIG. 3 the write/read data line bundles are not connected with a chip-intemal data path that is connected with the respective data input/output pads (I/Os) and is jointly used by all arrays 103a, 103b, 103c, 103d, but are directly connected with the corresponding data pins or data input/output pads (I/Os or Input/Outputs, respectively) (or—altemabvely—by the interposition of e.g. interface circuits 118a, 118b, 128a, 128b, 138a, 138b, 148a, 148b comprising corresponding line drivers, level converters, etc. which are respectively connected with the corresponding data pins via corresponding—not illustrated, —bi-directional lines).

The above-mentioned write/read data line bundles are directly connected to the amplifiers ((secondary) sense amplifiers) contained in the data read-in/read-out logic and provided for reading out the data stored in the memory cells (in other words, the data pins or data input/output pads of the semiconductor memory element 101 are directly connected to the data readin/read-out logic or array logic 119a, 119b, 119c, 119d in particulardirectly to the corresponding amplifiers ((secondary) sense amplifiers), (possibly by interposition of the above-mentioned interface circuits 118a, 118b, 128a, 128b, 138a, 138b, 148a, 148b, wherein these—as is illustrated in FIG. 3—may be positioned adjacent to or within the corresponding data read-in/read-out logic, or e.g. at the edge of the semiconductor memory element 101, adjacent to the respectively allocated data pins)).

Thus, via each of the data pins exclusively those data are guided that are destined for the corresponding, allocated array 103a, 103b, 103c, 103d and/or data that originate from the corresponding, allocated array 103a, 103b, 103c, 103d (and not data originating from and/or destined for the respectively other arrays).

The number 1 of data pins or data input/output pads, respectively, corresponds to the number k of memory cell arrays 103a, 103b, 103c, 103d provided in the semiconductor memory element 1, multiplied by the number n of lines provided for the respective array 103a, 103b, 103c, 103d in the respective write/read data line bundle (or the number n of columns (or lines, respectively) in the respective array 103a, 103b, 103c, 103d), or the above-mentioned fraction thereof) (thus here I=k×n=256 data pins or data input/output pads, respectively).

The n data pins or data input/output pads, respectively, allocated to the respective array 103a, 103b, 103c, 103d may e.g. be positioned at an edge of the semiconductor memory element 101 or semiconductor memory chip 101, respectively, which is adjacent (or e.g. respectively closest) to the respective array 103a, 103b, 103c, 103d.

By the direct connection of the data Input/output pads to the array logic 119a, 119b, 119c, 119d a larger amount of data may be written in the arrays 103a, 103b, 103c, 103d (or be read out therefrom, respectively) per time unit than with the semiconductor memory element 1 illustrated in FIG. 1 (or, respectively, can the clock frequency be increased without an increased CAS latency period resulting).

By the fact that, as described above, the respective data read-in/read-out logic 119a, 119b, 119c, 119d is arranged in the middle of the respective array 13a, 13b, 13c, 13d, the (maximum) length of the write/read lines ($d_{in/dout}$) (or of the corresponding write lines (($d_{in}$) and of the corresponding read lines ($d_{out}$)) leading from the respective data read-in/read-out logic 119a, 119b, 119c, 119d to the respective memory elements is shorter than, in particular only half as long as, with the semiconductor memory element 1 illustrated in FIG. 1.

Thus, the clock frequency can be further increased, this making it possible to write into (or read out from) the arrays 103a, 103b, 103c, 103d a further increased amount of data per time unit.

What is claimed is:

1. A RAM semiconductor memory element comprising a plurality of data pins and at least two memory cell arrays, each of which comprises a plurality of memory cells and each of which is connected to an array logic for reading in and/or reading out data into or from the respective array, wherein the data pins or interface circuits connected therewith are directly connected to the respective array logic, and wherein for each memory cell array, in accordance with the number of rows or columns of memory cells provided in a respective memory cell array, separate data pins are provided.

2. The semiconductor memory element according to claim 1, wherein the data pins or the interface circuits connected therewith are connected to the respective array logic without the interposition of a data path jointly used by the memory cell arrays.

3. The semiconductor memory element according to claim 2, wherein the data pins or the interface circuits connected therewith are directly connected to amplifier means provided in the respective array logic.

4. The semiconductor memory element according to claim 3, wherein the amplifier means are sense amplifiers or read amplifiers, respectively.

5. The semiconductor memory element according to claim 4, wherein the amplifier means are secondary sense amplifiers or secondary read amplifiers, respectively.

6. The semiconductor memory element according to claim 5, wherein said semiconductor memory element comprises more than three, in particular four, or more than eight, in particular nine or sixteen, memory cell arrays.

7. The semiconductor memory element according to claim 6, wherein more than 30 MBit, in particular more than 60 MBit, more than 120 MBit, or more than 250 MBit, can be stored in a memory cell array.

8. The semiconductor memory element according to claim 7, wherein more than 30, in particular more than 60 or more than 120, data pins are provided for each memory cell array.

9. The semiconductor memory element according to claim 8, wherein a first subset of the data pins is exclusively allocated to a first, and a second subset of the data pins is exclusively allocated to a second memory cell array, and wherein exclusively the data destined for the corresponding allocated arrays and/or originating from the corresponding allocated arrays are guided via the respective data pins.

10. The semiconductor memory element according to claim 9, wherein at least one corresponding array logic is positioned adjacent to the allocated array.

11. The semiconductor memory element according to claim 10, wherein at least one corresponding array logic is positioned within the allocated array.

12. The semiconductor memory element according to claim 11, wherein the at least one corresponding array logic is positioned in a middle area of the allocated array.

13. The semiconductor memory element according to claim 12, wherein said semiconductor memory element is a DRAM (Dynamic Random Access Memory).

14. The semiconductor memory element according to claim 13, wherein said semiconductor memory element is a DDR (Double Data Rate) semiconductor memory element.

15. A semiconductor memory element comprising:

a memory cell array having a plurality of memory cells arranged in rows and/or columns;

an array logic coupled to said plurality of memory cells;

a plurality of data pins coupled to said array logic for transferring data to and/or from said array logic; and said plurality of data pins corresponding to the number of memory cells such that each memory cell is provided with a corresponding data pin.

* * * * *